US005468986A

United States Patent [19]
Yamanashi

[11] Patent Number: 5,468,986
[45] Date of Patent: Nov. 21, 1995

[54] SEMICONDUCTOR STATIC RANDOM ACCESS MEMORY DEVICE WITH COVERED DRIVER TRANSISTORS

[75] Inventor: Mitsuhiro Yamanashi, Kawasaki, Japan

[73] Assignee: Kabushiki Kaisha Toshiba, Kawasaki, Japan

[21] Appl. No.: 250,490

[22] Filed: May 27, 1994

[30] Foreign Application Priority Data

May 31, 1993 [JP] Japan .................... 5-129622

[51] Int. Cl.⁶ .................... H01L 27/02; H01L 29/78
[52] U.S. Cl. .................... 257/389; 257/640; 257/903; 257/900
[58] Field of Search .................... 257/903, 904, 257/900, 640, 389

[56] References Cited

U.S. PATENT DOCUMENTS

| | | | |
|---|---|---|---|
| 4,881,108 | 11/1989 | Yoshikawa | 257/900 |
| 5,258,645 | 11/1993 | Sato | 257/640 |
| 5,324,974 | 6/1994 | Liao | 257/900 |

*Primary Examiner*—Robert P. Limanek
*Attorney, Agent, or Firm*—Finnegan, Henderson, Farabow, Garrett & Dunner

[57] ABSTRACT

A semiconductor memory device of the present invention includes a memory cell comprising two transfer transistors and two driver transistors in which a nitride film is covered only on these driver transistor areas. The nitride film is formed over source and drain regions and a gate electrode of the driver transistor.

4 Claims, 7 Drawing Sheets

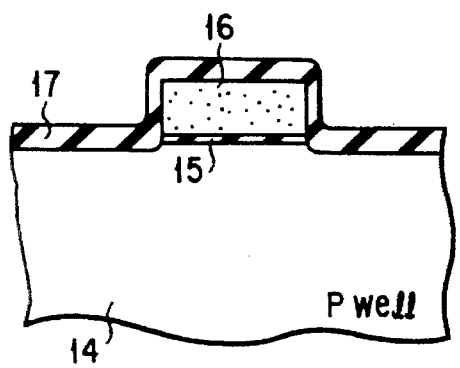
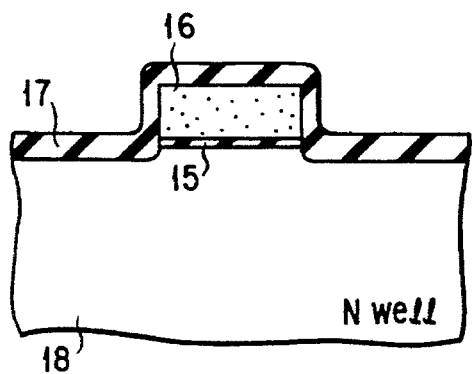
F I G. 2A     F I G. 2B
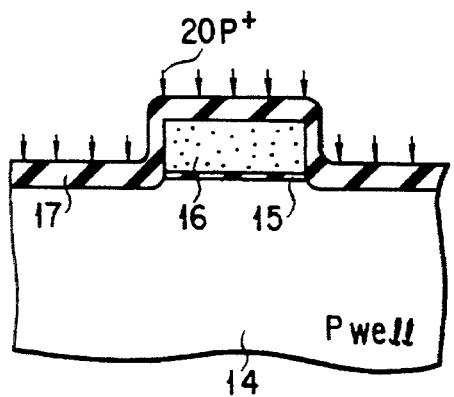
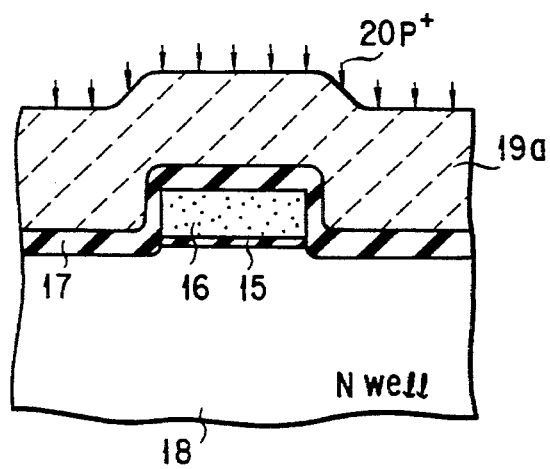
F I G. 3A     F I G. 3B
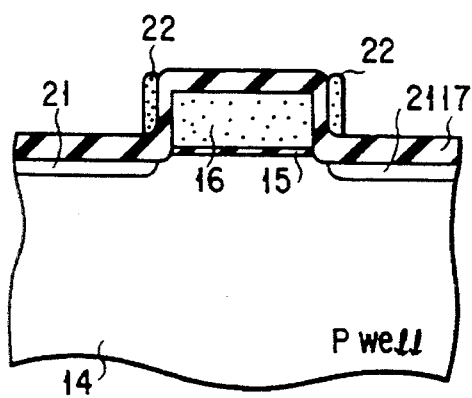
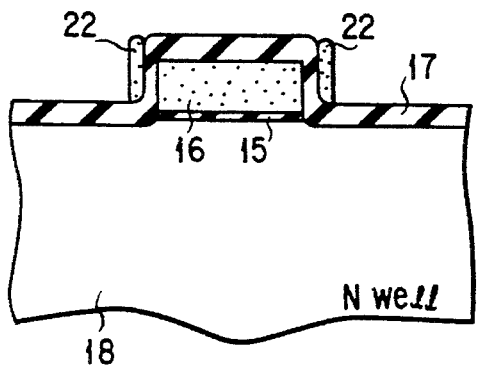
F I G. 4A     F I G. 4B

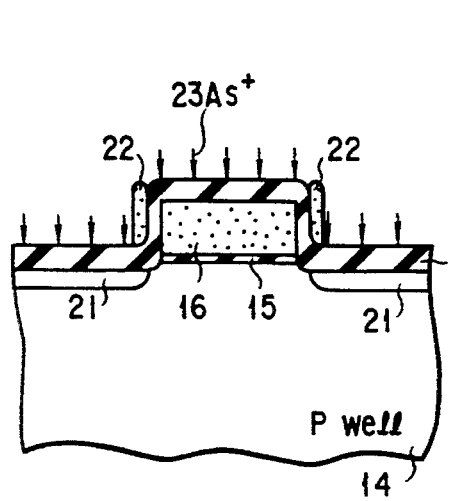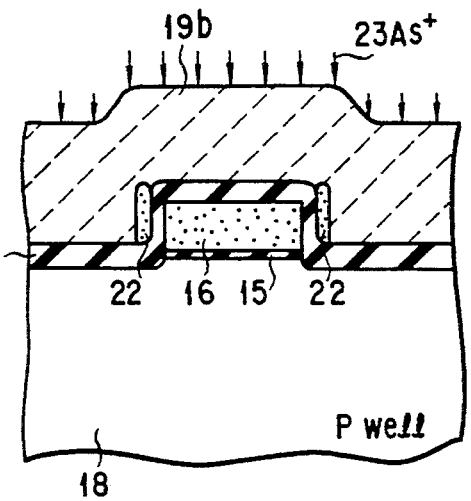
FIG. 5A  FIG. 5B
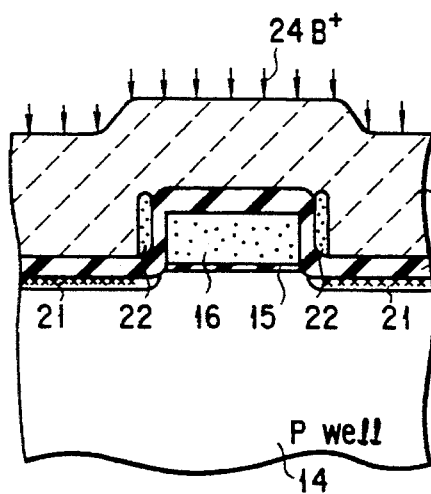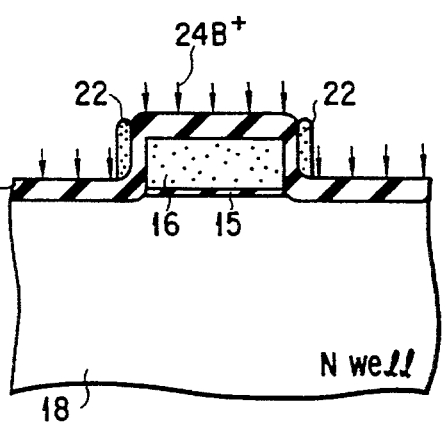
FIG. 6A  FIG. 6B
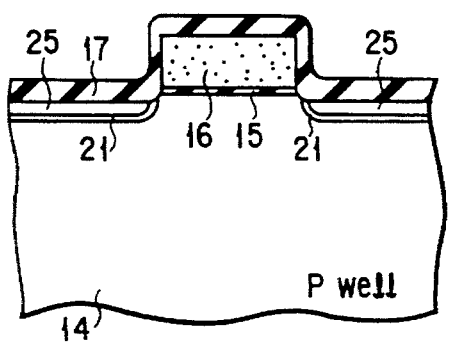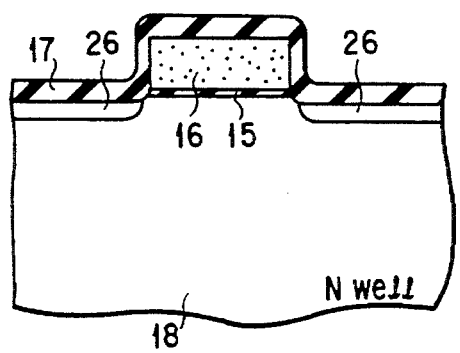
FIG. 7A  FIG. 7B

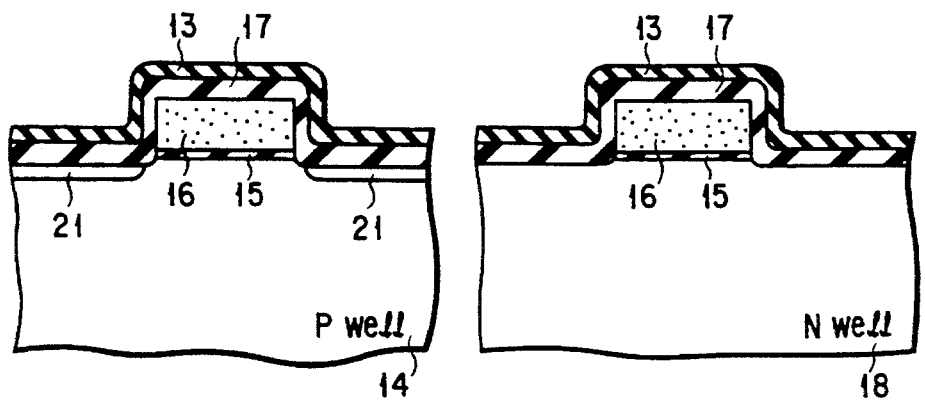
F I G. 13A          F I G. 13B
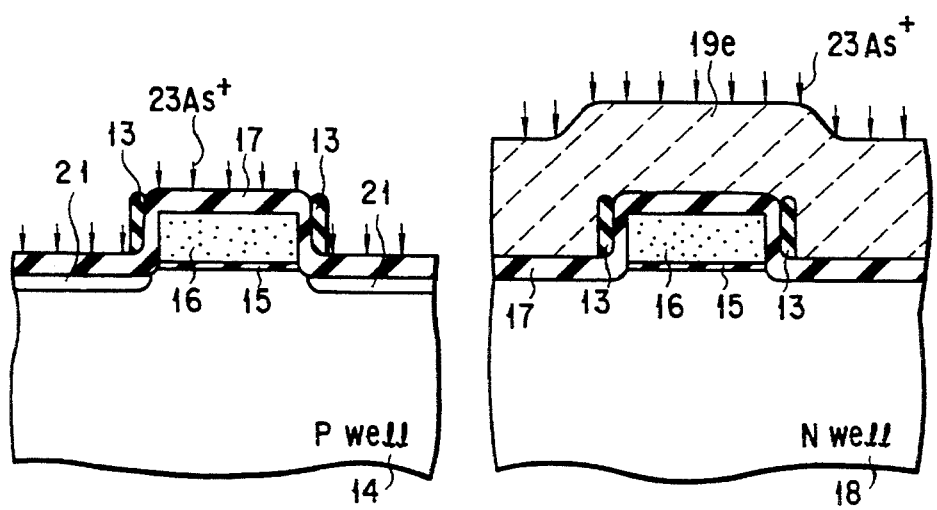
F I G. 14A          F I G. 14B
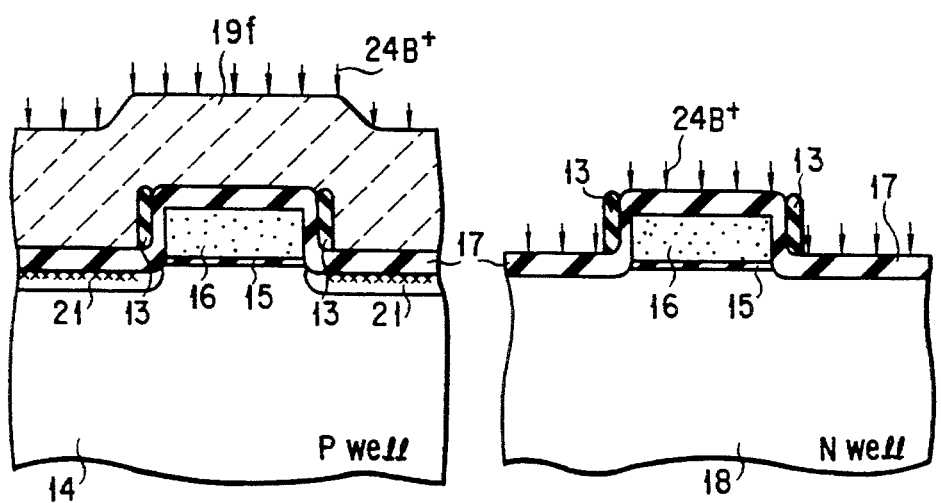
F I G. 15A          F I G. 15B

SEMICONDUCTOR STATIC RANDOM ACCESS MEMORY DEVICE WITH COVERED DRIVER TRANSISTORS

BACKGROUND OF THE INVENTION

1. Field of the Invention

The present invention relates to a static random access memory (hereinafter referred to as an SRAM) and, in particular, to driver transistors in a memory cell.

2. Description of the Prior Art

In general, an SRAM memory cell comprises two transfer transistors and driver transistors constituting a flip-flop. Here, the structure of the driver transistors in particular constituting a memory area will be explained below. In FIG. 18, a gate oxide film 102 and gate electrode 103 composed of polysilicon are formed at a P well 101 in a semiconductor substrate, not shown, and then an oxide film 104 is formed over the surface of a resultant structure. A first N type region (N type impurity: phosphorus) 105 and second N type region (N type impurity: arsenic) 106 are formed in the P well 101, the surface of the resultant semiconductor structure is covered with a passivation film 107.

In order to achieve a large-capacity SRAM, it is required that those transistors involved be formed in fine form. The formation of fine transistors leads to a decrease in capacitance of the transistors and hence there is a decrease in an amount of signal charge held in the driver transistor. As a result, through a funneling phenomenon caused by an a ray, etc., a soft error may occur whereby data stored in the N type regions is destroyed. Here, the capacitance of the transistor is intended to mean a resultant capacitance (hereinafter referred to as an effective capacitance) of a capacitance of the gate oxide film 102 between the gate electrode 103 and the P well 101 and an overlap capacitance between the gate electrode 103 and the second N type region (including the first N type region 105) 106.

As a countermeasure against such a soft error, use is made of a method for increasing an amount of signal charge by decreasing the thickness of the gate oxide film and hence increasing a storage capacity. However, decreasing the gate oxide film to an unlimited extent poses a problem against the gate oxide film. Further, the driver transistors are usually formed simultaneously with the transfer transistors and SRAM's peripheral circuits, etc., and it has been difficult to vary the thickness of the gate oxide film of the driver transistor only.

As described above, to obtain a large-capacity SRAM, it is necessary to form respective transistors in fine form. However, this leads to a decrease in an effective capacitance as the transistors are reduced. For the data-holding driver transistors, therefore, it is necessary to compensate for a decrease in the effective capacitance so as to take a soft error countermeasure. The method for achieving the thinning of the gate oxide film encounters difficulty in securing the reliability of such transistors. It is also difficult to do this from a standpoint of the technical process.

A demand has also been made for a high-speed SRAM and, therefore, it is not preferable to increase the effective capacitance for those transfer transistors for switching as well as for those transistors used in the peripheral circuits for SRAM.

SUMMARY OF THE INVENTION

One object of the present invention is to provide an SRAM including driver transistors having an increased effective capacitance.

Another object of the present invention is to provide an SRAM which can achieve less soft error and can be made as a high-speed unit.

Another object of the present invention is to provide a method for making a semiconductor memory device whose nitride-film-covered driver transistors are formed in a proper coordinating relation to those transfer transistors (NMOS) and peripheral circuits (PMOS).

According to one aspect of the present invention, a semiconductor memory device comprises a semiconductor substrate that includes a driver transistor having source and drain regions, a gate insulating film, and a gate electrode provided on the gate insulating film, a first insulating film covering the source and drain regions and the gate electrode, and a second insulating film provided at at least both sides of the gate electrode with the first insulating film intervening therebetween. In this case, a dielectric constant of the second insulating film is higher than that of the first insulating film to increase an overlap capacitance between the gate electrode and one of the source and drain regions.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 2A to 10A and 2B to 10B are cross-sectional views showing the steps of making a driver transistor area (NMOS) and PMOS, respectively, of the first embodiment:

FIGS. 2A and B representing one step;

FIGS. 3A and B, another step;

FIGS. 4A and B, another step;

FIGS. 5A and B, another step;

FIGS. 6A and B, another step;

FIGS. 7A and B, another step;

FIGS. 10A and B, another step of the making process;

FIGS. 13A and 17A and 13B and 17B are cross-sectional views showing the steps of making driver transistor areas (NMOS) and PMOS areas, respectively, of a second embodiment of the present invention: FIGS. 13A and B representing one step;

FIGS. 14A and B, another step;

FIGS. 15A and B another step;

FIGS. 17A and B, another step of the making process; and

DETAILED DESCRIPTION OF THE PREFERRED EMBODIMENTS

Figure 1A:
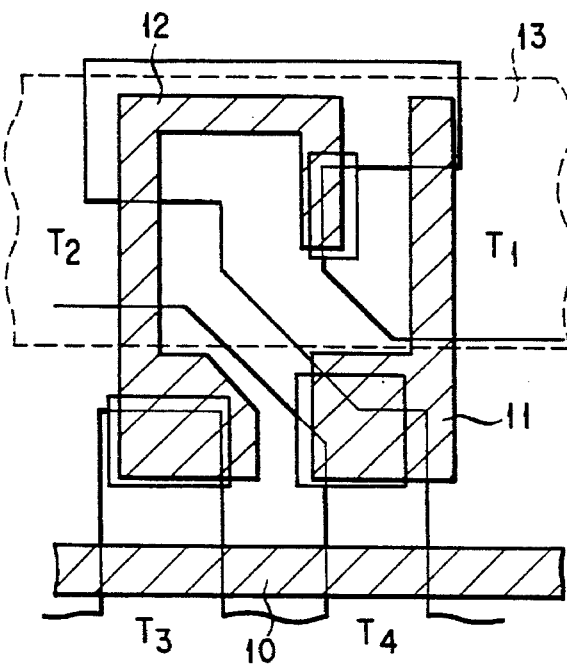
FIG 1A shows a pattern diagram of a memory cell in a first embodiment of the present invention.
Figure 1B:
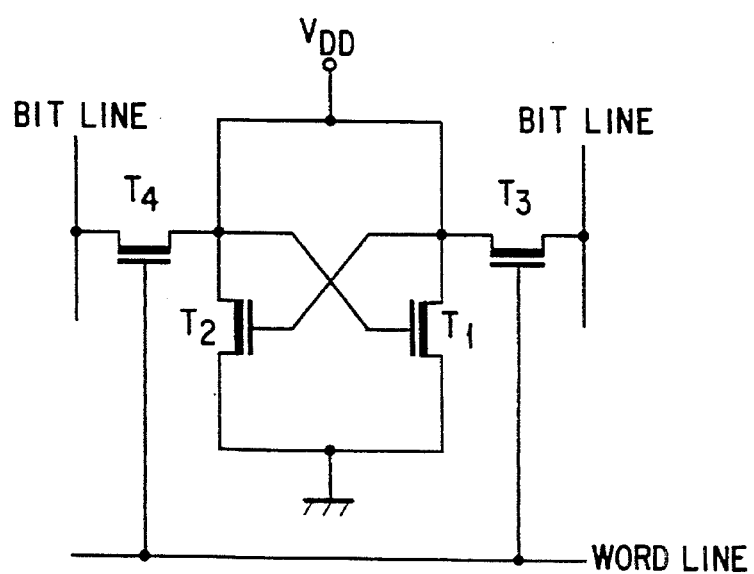
FIG. 1B shows an equivalent circuit of the memory cell of FIG. 1.

The structure of an SRAM according to a first embodiment of the present invention, as well as its making method, will be explained below with reference to FIGS. 1 to 10. In FIG. 1A, a memory cell comprises two transfer transistors $T_3$, $T_4$ formed below transfer transistor gate electrode 10, a first driver transistor $T_1$ formed below a first driver transistor gate electrode 11 and a second driver transistor $T_2$ formed below a second driver transistor gate electrode 12, the first and second driver transistors constituting a flip-flop. A nitride film 13 surrounded by a dot line is formed not over the transfer transistor areas, but solely over the first and second driver transistor areas (including diffusion regions and gate electrode each). The arrangement above, being indicated by an equivalent circuit, is as shown in FIG. 1B.

The method for making an SRAM as shown in FIG. 1A will be explained below with reference to FIGS. 2A to 10A and 2B to 10B. This is a method for making an SRAM (driver transistors (NMOS) in particular covered with the nitride film 13) and SRAM's peripheral circuit (PMOS in particular) at a time in a proper coordinating relation. FIGS. 2A to 10A show the making process of a driver transistor area and FIGS. 2B to 10B, the making process of a PMOS area.

First, as shown in FIG. 2A, a gate oxide film 15 and gate electrode 16 of polysilicon are provided, on a driver transistor area, over a P well 14 in a semiconductor substrate, not shown, and an oxide film 17 is covered on the surface of a resultant semiconductor structure. As shown in FIG. 2B, the same structure as in the case of FIG. 2A is similarly provided, at a PMOS area, over an N well 18 in the semiconductor substrate.

Then a resist pattern 19a is covered on the PMOS area only (FIG. 3B). Phosphorus 20 is ion implanted into the driver transistor area (FIG. 3A). A resist pattern 19a covered over the PMOS area is removed from the semiconductor structure. After annealing is performed, first N type regions 21 are formed in the P well 14 as shown in FIG. 4A. A polysilicon layer is deposited, by a CVD method, etc., on the oxide film 17 of the semiconductor structure, anisotropic etching is performed on the polysilicon layer selectively, and then the polysilicon layers 22 are formed only on side walls of the gate electrode (FIGS. 4A, 4B).

Then a resist pattern 19b is covered only over the PMOS area as showing in FIG. 5B and arsenic 23 is ion planted into the semiconductor structure at the driver transistor area as shown in FIG. 5A. After removing the resist pattern 19b from the PMOS area, a resist pattern 19c is covered only on the driver transistor area as shown in FIG. 6A and boron 24 is ion implanted into the PMOS area as shown in FIG. 6B. After removing the resist 19c and polysilicon layers 22 from the resultant structure, and annealing is performed so as to provide a second N type region 25 in the first N type region 21 as shown in FIG. 7A. A P type region 26 is also provided in the N well 18 as shown in FIG. 7B.

Figures 8A, 8B:
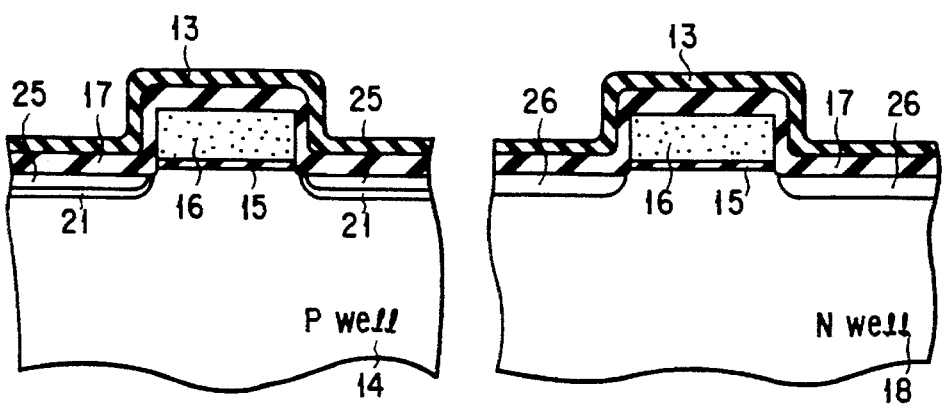
FIGS. 8A and B, another step.
Figures 9A, 9B:
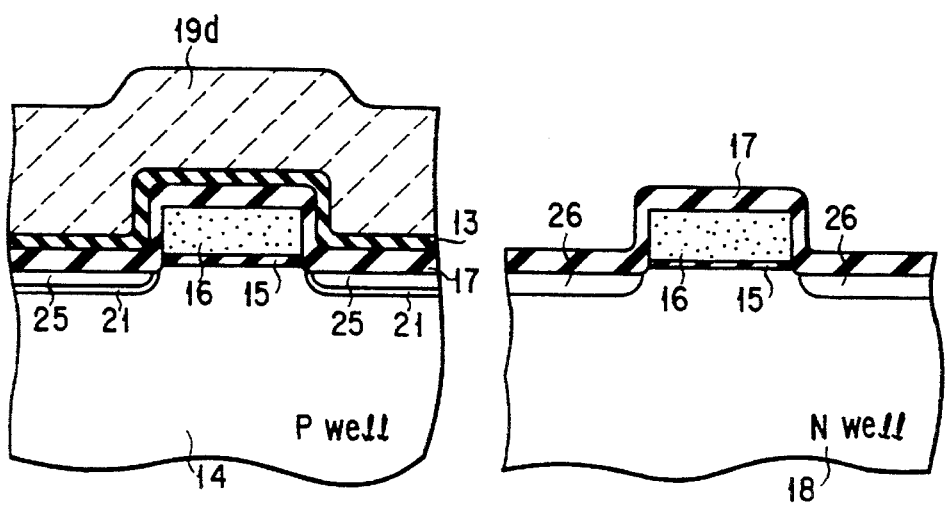
FIGS. 9A and B, another step.
Figures 10A, 10B:
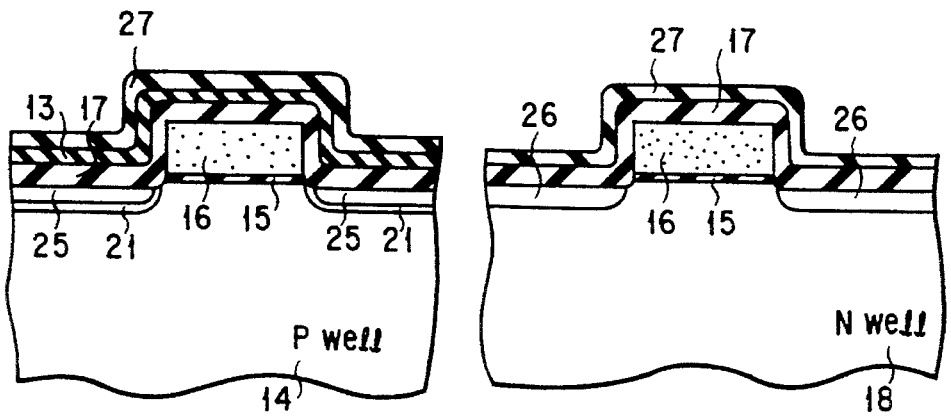

Then an about 500 Å-thick nitride film 13 is deposited, by a CVD method, on the oxide film 17 at the driver transistor area as shown in FIG. 8A and at the PMOS area as shown in FIG. 8B. A resist pattern 19d is covered only on the driver transistor area as shown in FIG. 9A and the nitride film 13 is removed at the PMOS area as shown in FIG. 9B. It is to be noted that the nitride film 13 is removed from the transfer transistor area of an SRAM as well as the PMOS area. Then the resist pattern 19d is removed from the driver transistor area and a passivation film 27 is grown, by the CVD method, on the semiconductor structure to a thickness of about 2000 Å as shown in FIG. 10A and 10B.

By the method as set out above, the nitride film 13 is formed at the driver transistor area, that is, at the area around the gate electrode 16 and at the second N type region 25 including the first N type region 21. By so doing it is possible to increase an overlap capacitance between the gate electrode 16 and the second N type region 25.

Figure 11:
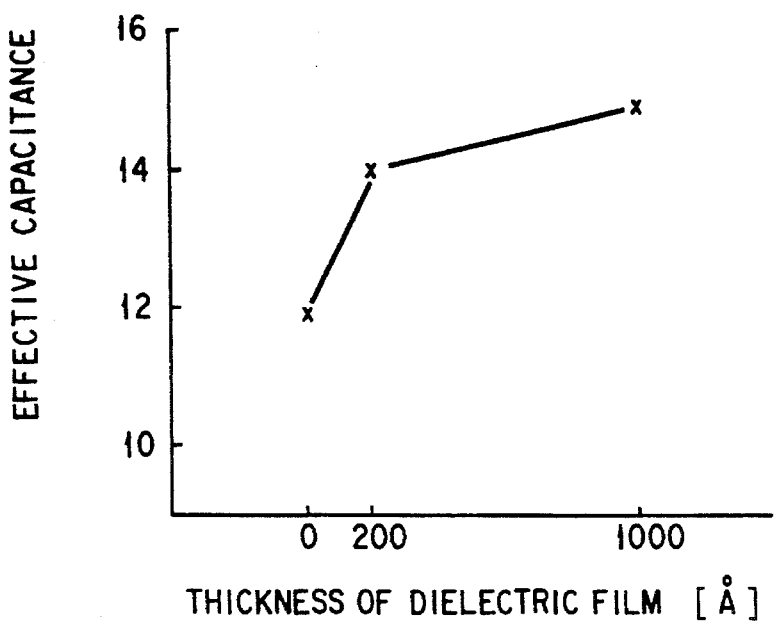
FIG. 11 is a graph showing an effect of a nitride (dielectric) film on driver transistors in the first embodiment of the present invention, the abscissa and ordinate axes representing the thickness of the nitride film and effective capacitance, respectively.

As evident from FIG. 11, an effect is obtained by covering the driver transistor area with the nitride film 13. FIG. 11 shows a variation of the effective capacitance with respect to the thickness of the nitride (dielectric) film with the thickness of the gate oxide film set constant for the transistor whose structure is as shown in FIG. 10A. It is to be noted that the effective capacitance indicates a resultant capacitance of the overlap capacitance and capacitance of the gate oxide film 15 between the gate electrode 16 and the P well 14. As appreciated from FIG. 11, the effective capacitance is increased with an increasing thickness of the nitride film. The thickness of the gate oxide film is constant and, hence, the capacitance of the gate oxide film is constant. Therefore, the increase in the effective capacitance is due to the increase in the overlap capacitance. That is, achieving such covering by the nitride film effectively increases the overlap capacitance, and the effective capacitance as well.

Figure 12:
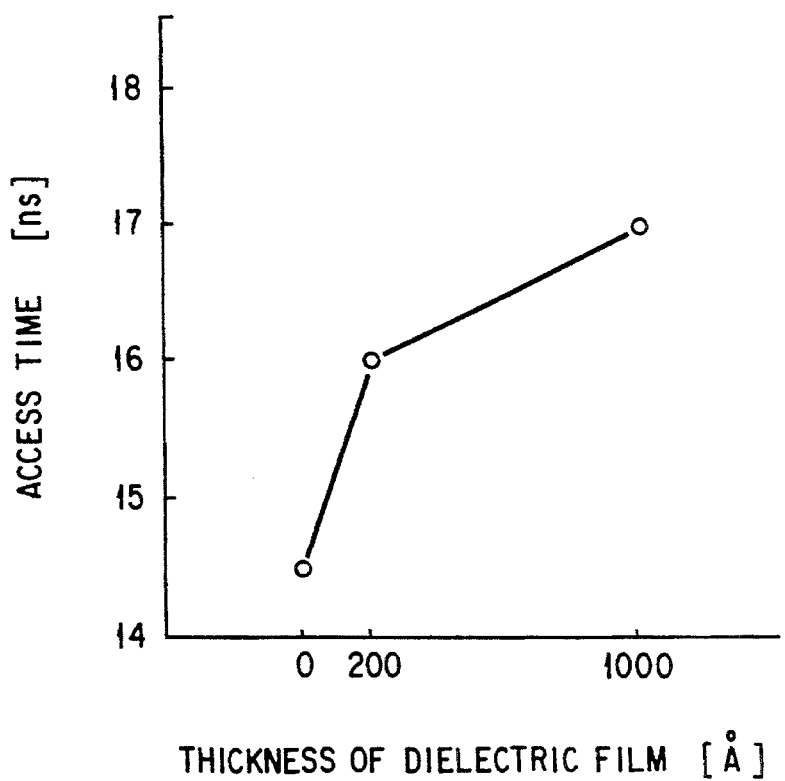
FIG. 12 is a graph showing a relation of a nitride (dielectric) film to a whole memory cell including driver and transfer transistors, the abscissa and ordinate axes representing the thickness of the dielectric film and access time, respectively.

FIG. 12 shows a variation in access time against the thickness of the nitride film when a driver transistor/transfer transistor memory cell is wholly covered with a nitride film. As appreciated from FIG. 12, the greater the thickness of the nitride (dielectric) film, the slower the access time. In consequence, the nitride film is not necessary to those devices required as high-speed units and it is not desirable to form the nitride film over all transistors involved. According to the embodiment of the present invention, the nitride film is formed at the driver transistors in the memory cell, that is, those transistors constituting a flip-flop, to the thickness of 200 to 1000 Å in particular, so that it is possible to suppress data destruction caused by the soft error and, at the same time, to maintain high-speed performance.

A second embodiment of the present invention will now be explained below.

Although, in the first embodiment, the nitride film 13 is covered over the whole surface of the driver transistor's regions 21, 25 and gate electrode 16, a nitride film is formed only on the side walls of a gate electrode 16 of a driver transistor, in the second embodiment. The making method above will be explained below with reference to FIGS. 13A to 17A and 13B to 17B. Like the first embodiment, letters A and B attached to FIGS. 13A to 17A and 13B to 17B represent the making steps of a driver transistor area and PMOS area, respectively.

First, those steps as shown in FIGS. 2A and 2B and FIGS. 3A and B are carried out. After the removal of a resist pattern 19a as shown in FIG. 3B, annealing is carried out to provide a first N type regions 21 in a P well 14 of a substrate. An about 1000 Å-thick nitride film 13 is deposited, by the CVD method, on the whole surface of an oxide film 17 (FIGS. 13A and B).

The nitride film 13 is anisotropic etched-selectively, so as to form the nitride film 13 only on the side walls of the gate electrode 16. A resist pattern 19e is covered only over a PMOS area as shown in FIG. 14B and arsenic 23 is ion implanted in a resultant structure as shown in FIG. 14A.

A resist pattern 19f is covered only over a driver transistor area as shown in FIG. 15A and boron 24 is ion implanted at the PMOS area as shown in FIG. 5B.

Figures 16A, 16B:
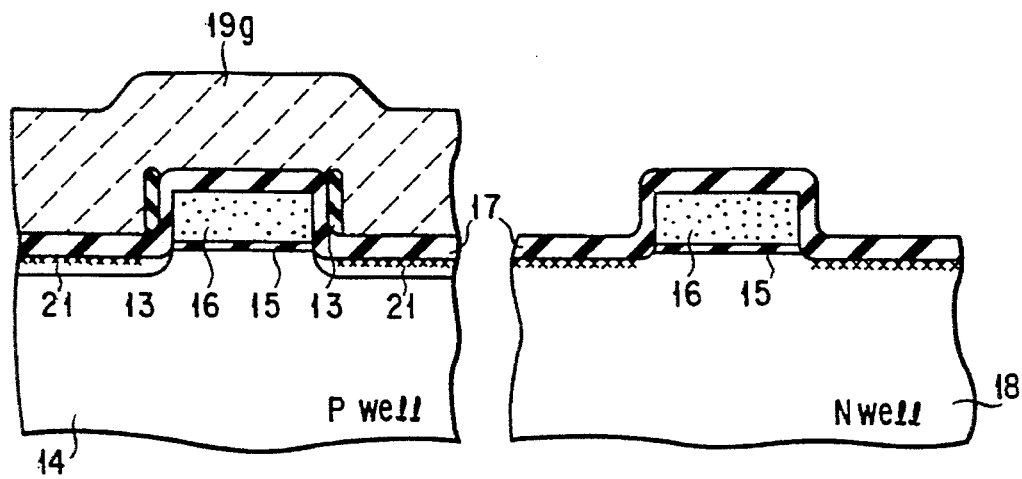
FIGS. 16A and B, another step.
Figures 17A, 17B:
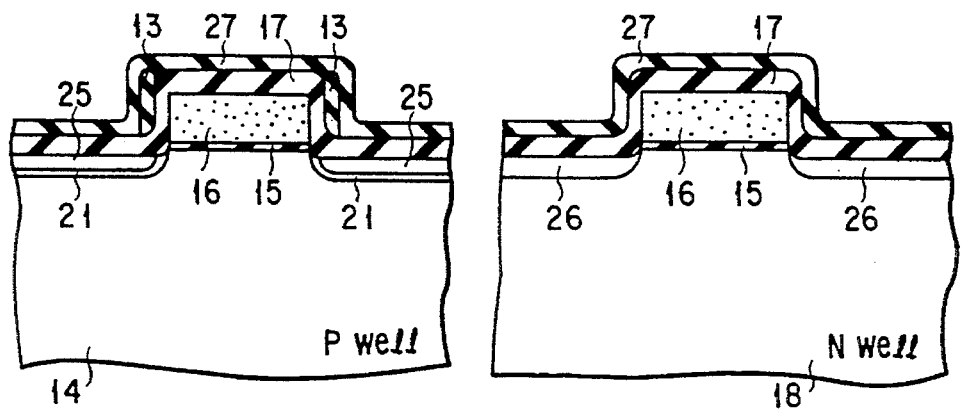
Figure 18:
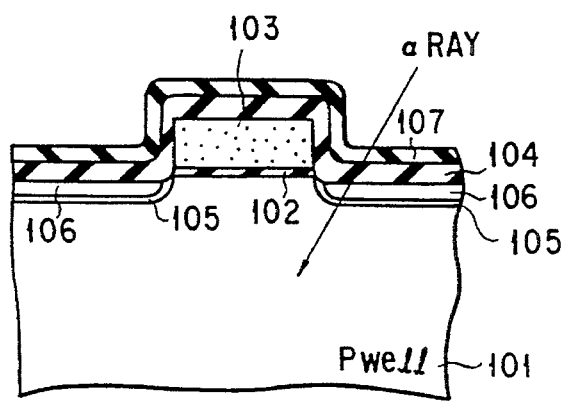
FIG. 18 is a cross-sectional view showing a conventional driver transistor.

A resist pattern 19g is covered over the PMOS area as shown in FIG. 16A and isotropic etching is done to remove the nitride film 13 from the PMOS area as shown in FIG. 16B. A second N type region 25 is formed in a first N type region 21 and a P type region 26 is formed in an N well 18. An about 2000 Å-thick passivation film 27 is grown, by the CVD method, on the whole surface of a resultant structure as shown in FIGS. 17A and B.

By so doing, the nitride film is formed only over the side wall of a gate electrode of the driver transistor. In the case where the nitride film has the same thickness at the first and second embodiments, the overlap capacitance is smaller in the second embodiment than in the first embodiment, but it is useful to need a high-speed unit in the second embodiment. For the first embodiment, the polysilicon layer is used at the side wall of the gate electrode in obtaining an LDD structure and then the polysilicon layer is removed, followed by the formation of a nitride film. For the second embodiment, on the other hand, the nitride film is employed in obtaining an LDD structure, so that less making steps are obtained.

Although, in the second embodiment, the nitride film is used at the side wall of the gate electrode of all the transistors involved, polysilicon layer can be used for those transistors other than the driver transistors.

In SRAM of the present invention, the nitride film (high dielectric film) is covered only on the driver transistor areas in the memory cell which hold data. In this way, it is possible to increase the gate electrode-to-diffusion region capacitance and hence the effective capacitance. It is also possible to reduce the soft error. Further, those transistors other than the driver transistors, for example, those transfer transistors and peripheral circuit, are not covered with the nitride film and ensure high-speed performance.

It is further understood by those skilled in the art that the foregoing description is only of the preferred embodiments and that various changes and modifications may be made in the invention without departing from the spirit and scope thereof.

What is claimed is:

1. A static random access memory comprising:

a semiconductor substrate having a main surface;

a first and a second driver transistor formed on said main surface, each said driver transistor having a first source region, a first drain region, a first gate insulating film, and a first gate electrode provided on said first gate insulating film, said first and said second driver transistors being coupled to each other to form a flip-flop formation for storing data;

a first and a second transfer transistor formed on said main surface, each said transfer transistor having a second source region, a second drain region, a second gate insulating film, and a second gate electrode provided on said second gate insulating film, said second gate electrodes being connected to a word line, said second drain regions being electrically connected to said first gate electrodes correspondingly, said second source regions being connected to bit lines;

a first insulating film covering said driver transistors and said transfer transistors; and a second insulating film provided at both sides of said first gate electrodes with said first insulating film intervening therebetween, said second insulating film not provided on said first and second transfer transistors and having a higher dielectric constant than that of said first insulating film to increase an overlap capacitance between said first gate electrodes and one of said first source and said first drain regions.

2. The semiconductor memory device according to claim 1, wherein said second insulating film is further provided over said first source and said first drain regions and upper surfaces of said first gate electrodes with said first insulating film intervening therebetween.

3. The semiconductor memory device according to claim 1, wherein said second insulating film is a nitride film.

4. The semiconductor memory device according to claim 1, wherein said second insulating film is 200 to 1000 Å in thickness.

* * * * *